(12) United States Patent
Choo et al.

(10) Patent No.: US 10,490,289 B2
(45) Date of Patent: Nov. 26, 2019

(54) VOLTAGE GENERATOR FOR A NONVOLATILE MEMORY DEVICE, AND A METHOD OF OPERATING THE VOLTAGE GENERATOR

(71) Applicant: Samsung Electronics Co., Ltd., Suwon-si (KR)

(72) Inventors: Gyo-Soo Choo, Yongin-si (KR); Ji-Hyun Park, Yongin-si (KR); Chi-Weon Yoon, Seoul (KR); Moo-Sung Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/860,891

(22) Filed: Jan. 3, 2018

(65) Prior Publication Data
US 2019/0027224 A1    Jan. 24, 2019

(30) Foreign Application Priority Data
Jul. 18, 2017  (KR) .................. 10-2017-0091186

(51) Int. Cl.
  *G11C 16/30*      (2006.01)
  *G11C 16/04*      (2006.01)
  (Continued)

(52) U.S. Cl.
  CPC .............. *G11C 16/30* (2013.01); *G05F 3/262* (2013.01); *G11C 16/0483* (2013.01); *G11C 16/08* (2013.01); *G11C 16/26* (2013.01); *H01L 27/1157* (2013.01); *H01L 27/11524* (2013.01); *H01L 27/11556* (2013.01); *H01L 27/11582* (2013.01)

(58) Field of Classification Search
  None
  See application file for complete search history.

(56) References Cited

U.S. PATENT DOCUMENTS

| | | | | |
|---|---|---|---|---|
| 6,084,387 A | * | 7/2000 | Kaneko | H02M 3/073 323/274 |
| 6,424,121 B1 | * | 7/2002 | Khouri | G11C 11/56 320/128 |

(Continued)

FOREIGN PATENT DOCUMENTS

JP    2009-289367    12/2009

*Primary Examiner* — Douglas King
(74) *Attorney, Agent, or Firm* — Muir Patent Law, PLLC

(57) ABSTRACT

A voltage generator of a nonvolatile memory device includes a charging circuit, a current mirror circuit, a discharging circuit and an output circuit. The charging circuit amplifies a difference between a reference voltage and a feedback voltage to generate a first current. The current mirror circuit is connected to the charging circuit and generates a second current based on the first current. The discharging circuit is connected to the current mirror circuit to draw the second current, and discharges the output voltage to a target level by adjusting discharging amount of the second current based on a sensing voltage which reflects a change of the feedback voltage. The output circuit is connected to the current mirror circuit, and provides the output voltage based on the first current and the second current to a first word-line connected to an output node.

14 Claims, 16 Drawing Sheets

(51) Int. Cl.
*G11C 16/08* (2006.01)
*G05F 3/26* (2006.01)
*G11C 16/26* (2006.01)
*H01L 27/1157* (2017.01)
*H01L 27/11582* (2017.01)
*H01L 27/11556* (2017.01)
*H01L 27/11524* (2017.01)

(56) References Cited

U.S. PATENT DOCUMENTS

| | | |
|---|---|---|
| 6,724,245 B2 | 4/2004 | Kwon et al. |
| 7,453,750 B2 | 11/2008 | Kim |
| 7,616,502 B2 | 11/2009 | Iwai |
| 8,363,466 B2 | 1/2013 | Shinozaki et al. |
| 8,873,299 B2 * | 10/2014 | Kaneko ............... G11C 16/0483 |
| | | 365/185.11 |
| 9,093,155 B2 | 7/2015 | Sakurai |
| 9,287,835 B2 | 3/2016 | Chen et al. |
| 2002/0118568 A1 * | 8/2002 | Tanzawa ................ G11C 5/147 |
| | | 365/185.11 |
| 2006/0274564 A1 * | 12/2006 | Kim ..................... G11C 11/5628 |
| | | 365/100 |
| 2007/0047322 A1 * | 3/2007 | Chung ................... G11C 5/145 |
| | | 365/185.23 |
| 2016/0049206 A1 * | 2/2016 | Huynh ................... G11C 16/30 |
| | | 365/185.21 |

* cited by examiner

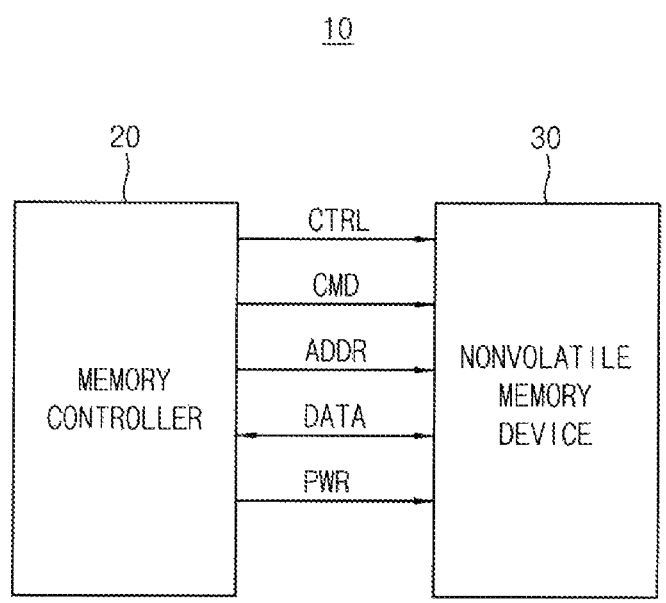

VOLTAGE GENERATOR FOR A NONVOLATILE MEMORY DEVICE, AND A METHOD OF OPERATING THE VOLTAGE GENERATOR

CROSS-REFERENCE TO RELATED APPLICATION

This application claims priority under 35 USC § 119 to Korean Patent Application No. 10-2017-0091186, filed on Jul. 18, 2017, in the Korean Intellectual Property Office (KIPO), the disclosure of which is incorporated in its entirety by reference herein.

BACKGROUND

1. Technical Field

Exemplary embodiments relate generally to memory devices, and more particularly to voltage generators of nonvolatile memory devices, nonvolatile memory devices and methods of operating nonvolatile memory devices.

2. Discussion of the Related Art

A flash memory device may be used as a data storage for information appliances such as a computer, a cellular phone, a personal digital assistant (PDA), a digital camera, a camcorder, a voice recorder, an MP3 player, a handheld personal computer (PC), a game machine, a facsimile, a scanner, a printer, and the like.

Conventionally, the flash memory device is vulnerable for signal noises generated during its operation for its high density and small feature. For example, a selected word-line may be influenced by a voltage applied to an adjacent word-line.

SUMMARY

Some exemplary embodiments provide a voltage generator of a nonvolatile memory device, capable of reducing coupling noises caused by a voltage applied to an adjacent word-line.

Some exemplary embodiments provide a nonvolatile memory device capable of reducing coupling noises caused by a voltage on an adjacent word-line.

Some exemplary embodiments provide a method of operating a nonvolatile memory device, capable of reducing coupling noises caused by a voltage applied on an adjacent word-line.

According to exemplary embodiments, a voltage generator of a nonvolatile memory device includes a charging circuit, a current mirror circuit, a discharging circuit and an output circuit. The charging circuit amplifies a difference between a reference voltage and a feedback voltage and generate a first current based on the difference. The feedback voltage is obtained by dividing an output voltage at an output node. The current mirror circuit is connected to a first power supply voltage, and is connected to the charging circuit at a first node and generates a second current based on the first current. The discharging circuit is connected to a second power supply voltage, and is connected to the current mirror circuit at a second node to draw the second current, and discharges the output voltage to a target level by adjusting discharging amount of the second current based on a sensing voltage. The sensing voltage reflects a change of the feedback voltage. The output circuit is connected to the first power supply voltage, and is connected to the current mirror circuit at a third node, and provides the output voltage based on the first current and the second current to a first word-line connected to the output node.

According to exemplary embodiments, a nonvolatile memory device includes a memory cell array in which a plurality of nonvolatile memory cells are arranged, a voltage generation circuit, and address decoder and a control circuit. The voltage generation circuit generates word-line voltages to be applied to the memory cell array. The address decoder is connected to the memory cell array through word-lines. The control circuit controls the voltage generation circuit and the address decoder based on a command and an address. The voltage generation circuit includes a first voltage generator to generate a first voltage to be applied to a first word-line which is selected of the word-lines based on the address. The first voltage generator discharges the first voltage to a target level in response to a first current and a second current to provide the first voltage to an output node connected to the first word-line. The first current is based on a feedback voltage obtained by dividing the first voltage and the second current is based on a sensing voltage reflecting a change of the feedback voltage.

According to exemplary embodiments, in a method of operating a nonvolatile memory device including a memory cell array which includes a plurality of nonvolatile memory cells, a command and an address from a memory controller are received and a first voltage and a second voltage is generated by a voltage generation circuit based on the command and the address. The first voltage is to be applied to a first word-line selected of word-lines by an address decoder coupled to the memory cell array through the word-lines and the second voltage is to be applied to unselected word-lines of the word-lines. The first voltage, by the address decoder, is applied to the first word-line while the second voltage is being to the unselected word-lines, and sensing operation is performed on first memory cells coupled to the first word-line. The first voltage is varied to cancel an influence due to coupling to the first word-line generated by the second voltage on a second word-line adjacent to the first word-line.

Accordingly, when a level of a first voltage, which is applied to a selected word-line, at the output node, is changed since the first voltage is coupled to a second voltage on an adjacent word-line, a voltage generator may reduce an influence of the coupling of the second voltage on the adjacent word-line adaptively and in analog fashion by generating an adjusting current determined according to a sensing voltage of an internal node, which reflects a change of the level of the first voltage inverse-proportionally and by sinking the adjusting current to a ground voltage.

BRIEF DESCRIPTION OF THE DRAWINGS

Illustrative, non-limiting exemplary embodiments will be more clearly understood from the following detailed description in conjunction with the accompanying drawings.

FIG. 1 is a block diagram illustrating a memory system according to exemplary embodiments.

FIG. 2 is a table illustrating control signals in the memory system of FIG. 1.

DETAILED DESCRIPTION OF THE EMBODIMENTS

Exemplary embodiments will be described more fully hereinafter with reference to the accompanying drawings.

FIG. 1 is a block diagram illustrating a memory system according to exemplary embodiments.

Referring to FIG. 1, a memory system (or, a nonvolatile memory system) 10 may include a memory controller 20 and at least one nonvolatile memory device 30.

The memory system 10 may include flash memory based data storage media such as a memory card, a universal serial bus (USB) memory and solid state drive (SSD).

The nonvolatile memory device 30 may perform an erase operation, a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

FIG. 2 is a table illustrating control signals in the memory system of FIG. 1.

Referring to FIGS. 1 and 2, the control signal CTRL may include a command latch enable signal CLE, an address latch enable signal ALE, a chip enable signal nCE, a read enable signal nRE, and a write enable signal nWE.

The memory controller 20 may transmit the command latch enable signal CLE to the nonvolatile memory device 30. The command latch enable signal CLE may be a signal indicating that information transferred via the input/output lines is a command. The memory controller 20 may transmit the address latch enable signal ALE to the nonvolatile memory device 30. The address latch enable signal ALE may be a signal indicating that information transferred via the input/output lines is an address.

The memory controller 20 may transmit the chip enable signal nCE to the nonvolatile memory device 30. The chip enable signal nCE may indicate a memory chip selected from among a plurality of memory chips when the nonvolatile memory device includes the plurality of memory chips.

The memory controller 20 may transmit the read enable signal nRE to the nonvolatile memory device 30. The nonvolatile memory device 30 may transmit read data to the memory controller 20 based on the read enable signal nRE.

The memory controller 20 may transmit the write enable signal nWE to the nonvolatile memory device 30. When the write enable signal nWE is activated, the nonvolatile memory device 30 may store data input signals provided from the memory controller 20 as a command CMD or an address ADDR.

Figure 3:
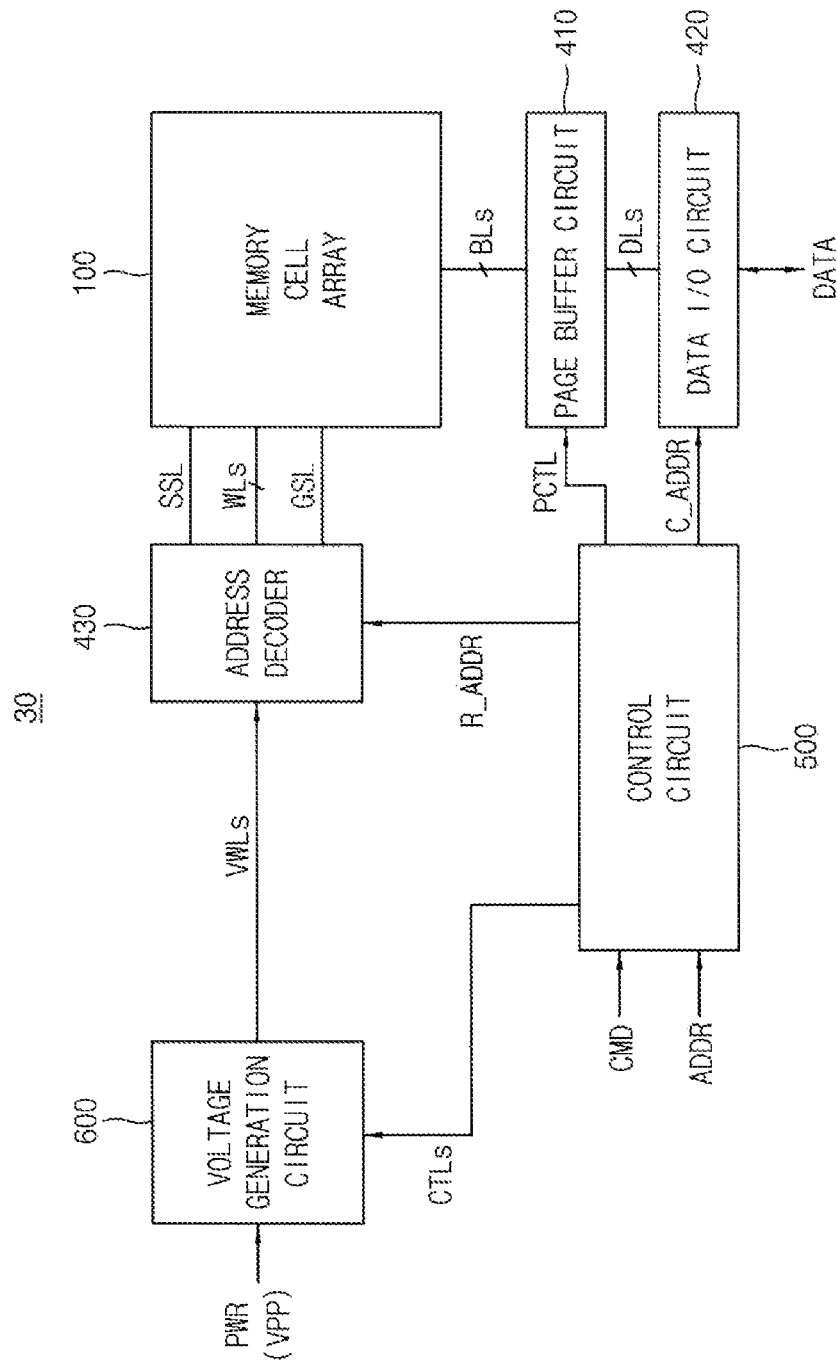
FIG. 3 is a block diagram illustrating the nonvolatile memory device in the memory system of FIG. 1.

FIG. 3 is a block diagram illustrating the nonvolatile memory device of the memory system of FIG. 1 according to exemplary embodiments.

Referring to FIG. 3, the nonvolatile memory device 30 includes a memory cell array 100, an address decoder 430, a page buffer circuit 410, a data input/output circuit 420, a control circuit 500, and a voltage generation circuit 600.

The memory cell array 100 may be coupled to the address decoder 430 through a string selection line SSL, a plurality of word-lines WLs, and a ground selection line GSL. In addition, the memory cell array 100 may be coupled to the page buffer circuit 410 through a plurality of bit-lines BLs. The memory cell array 100 may include a plurality of nonvolatile memory cells coupled to the plurality of word-lines WLs and the plurality of bit-lines BLs. The plurality of nonvolatile memory cells may be arranged in the memory cell array 100.

In some exemplary embodiments, the memory cell array 100 may be a three-dimensional memory cell array, which is formed on a substrate in a three-dimensional structure (or a vertical structure). In this case, the memory cell array 100 may include vertical cell strings stacked in vertical direction so that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 100 may be a two-dimensional memory cell array, which is formed on a substrate in a two-dimensional structure (or a horizontal structure).

Figure 4:
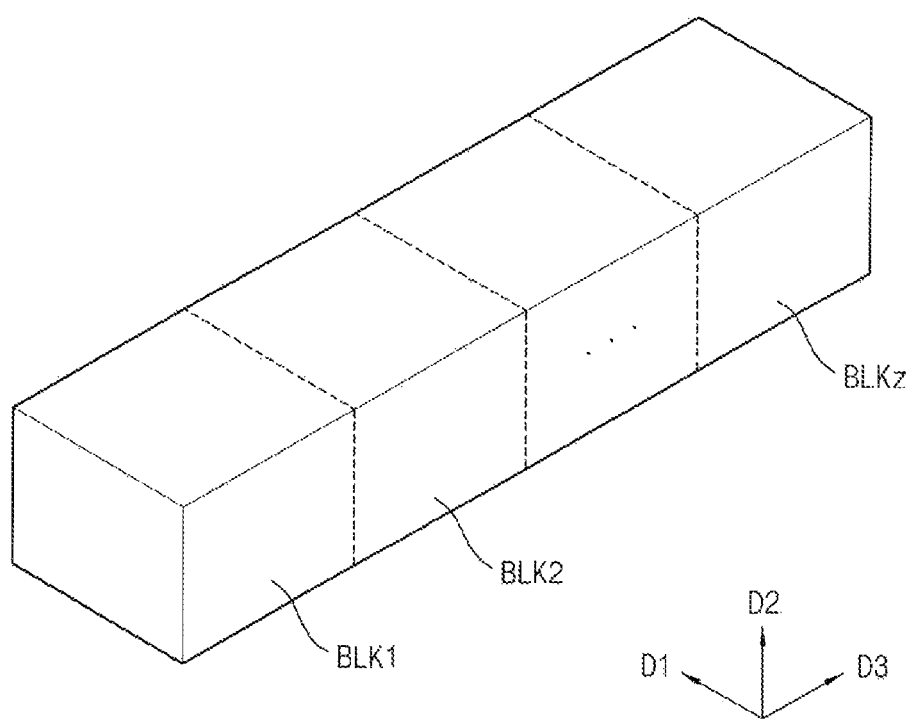
FIG. 4 is a block diagram illustrating the memory cell array in FIG. 3.

FIG. 4 is a block diagram illustrating the memory cell array in FIG. 3.

Referring to FIG. 4, the memory cell array 100 may include a plurality of memory blocks BLK1 to BLKz extending in first through third directions D1, D2 and D3. In an embodiment, the memory blocks BLK1 to BLKz are selected by the address decoder 430 in FIG. 3. For example, the address decoder 430 may select a memory block BLK corresponding to a block address among the memory blocks BLK1 to BLKz.

Figure 5:
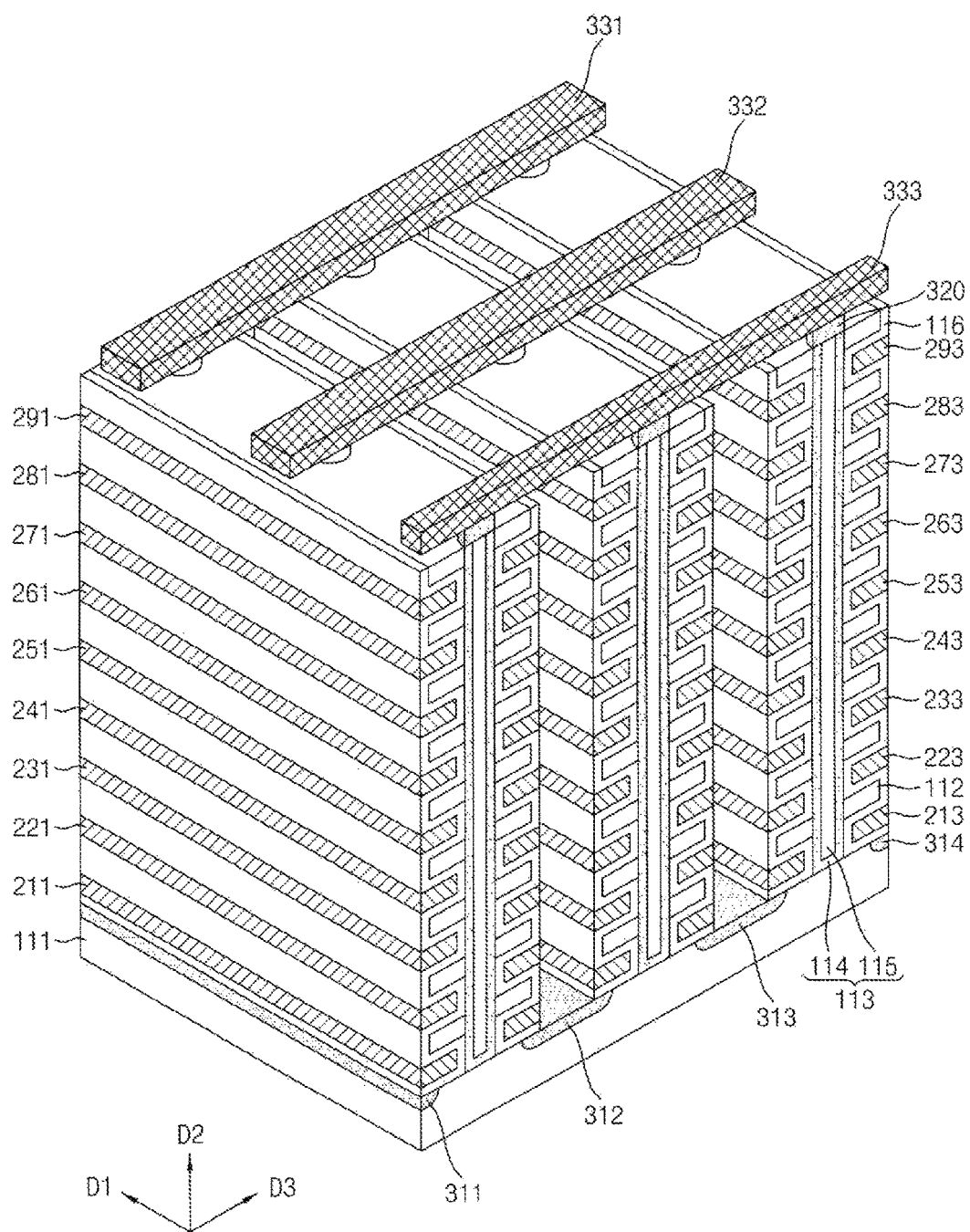
FIG. 5 is a perspective view illustrating one of the memory blocks of FIG. 4.

FIG. 5 is a perspective view illustrating one of the memory blocks of FIG. 4.

Referring to FIG. 5, the memory block BLKi includes cell strings which are formed on a substrate in a three-dimensional structure (or a vertical structure). The memory block BLKi includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type packet well). However, the conductive type of the substrate 111 is not limited to the p-type. A plurality of doping regions 311 to 314 extending along the first direction D1 are provided on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials are provided along the third direction D3, being spaced by a specific distance. Exemplarily, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the second direction D2 of the last insulation material 112 may be removed.

First conductive materials 211 to 291 are provided on the exposed surface of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer at the bottom of the insulation material disposed on the top of the specific insulation material. That is, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 212 to 292 extending along the first direction.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the second direction D2, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

Figure 6:
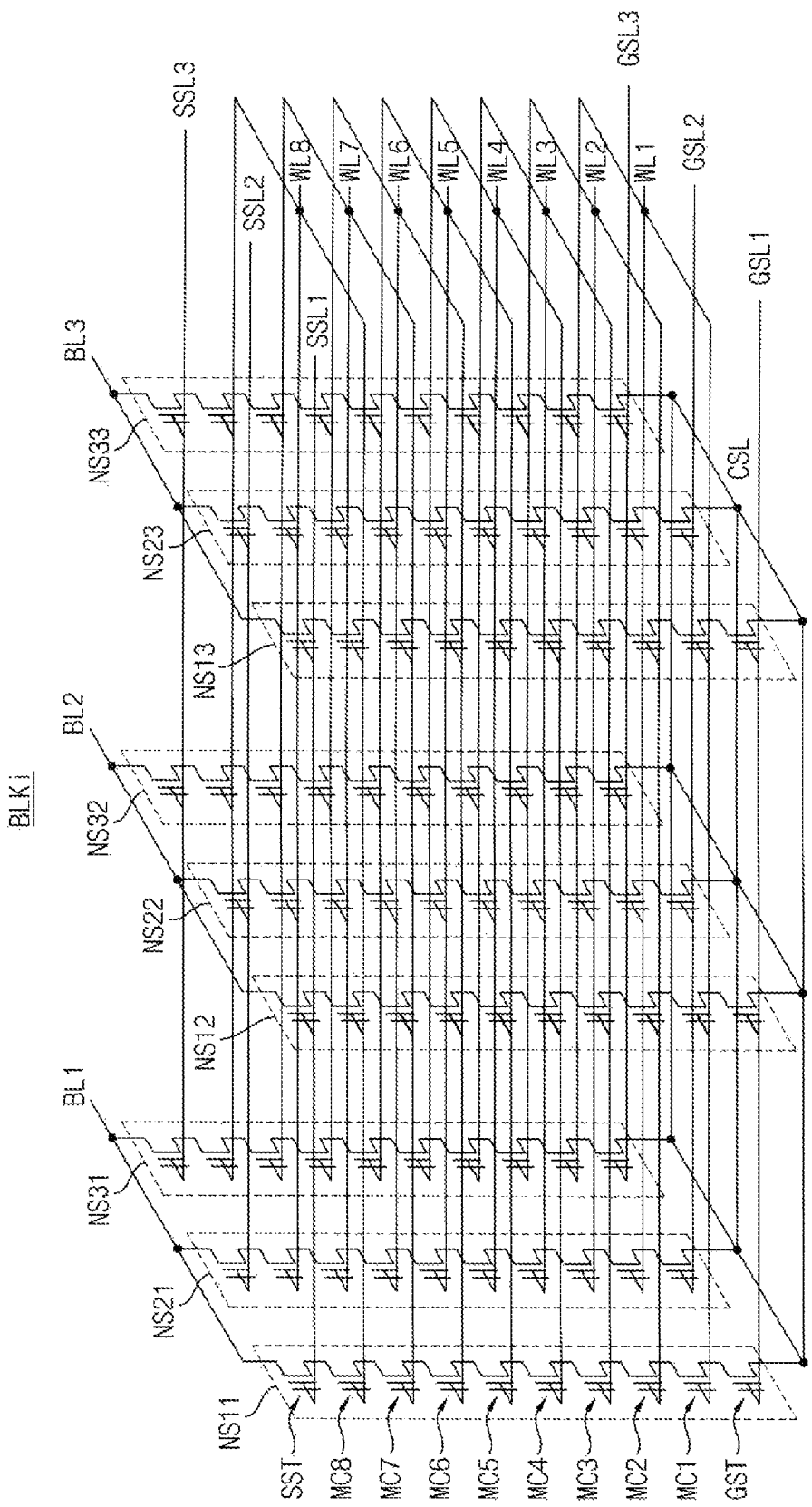
FIG. 6 is a circuit diagram illustrating an equivalent circuit of the memory block described with reference to FIG. 5.

FIG. 6 is a circuit diagram illustrating an equivalent circuit of the memory block described with reference to FIG. 5.

The memory block BLKi of FIG. 6 may be formed on a substrate in a three-dimensional structure (or a vertical structure). For example, a plurality of memory cell strings included in the memory block BLKi may be formed in a direction perpendicular to the substrate.

Referring to FIG. 6, the memory block BLKi may include memory cell strings NS11 to NS33 coupled between bit-lines BL1, BL2 and BL3 and a common source line CSL.

Figure 10:
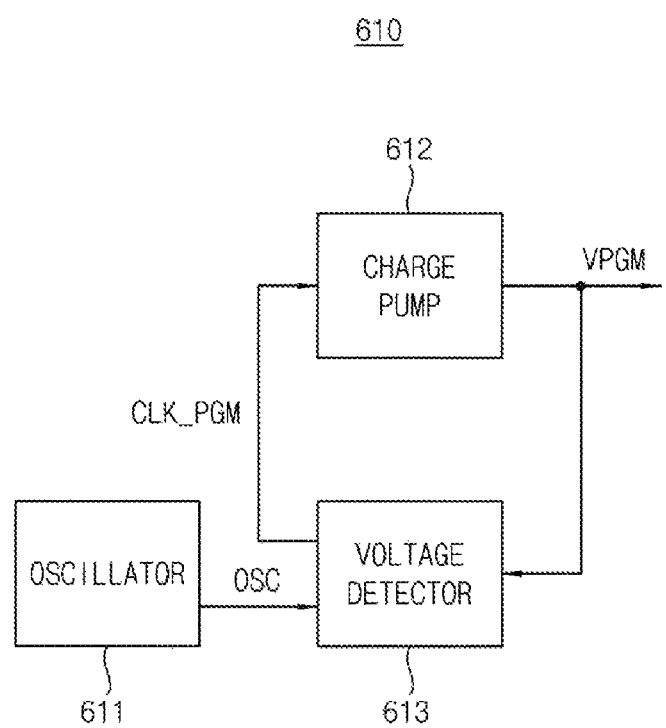
FIG. 10 is a block diagram illustrating the program voltage generator in the voltage generation circuit of FIG. 9 according to exemplary embodiments.

Each of the memory cell strings NS11 to NS33 may include a string selection transistor SST, a plurality of memory cells MC1 to MC8, and a ground selection transistor GST. In FIG. 10, each of the memory cell strings NS11 to NS33 is illustrated to include eight memory cells MC1 to MC8. However, exemplary embodiments are not limited thereto. In some exemplary embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 6, the memory block BLKb is illustrated to be coupled to eight word-lines WL1 to WL8 and three bit-lines BL1 to BL3. However, exemplary embodiments are not limited thereto. In some exemplary embodiments, the memory cell array 100a may be coupled to any number of word-lines and bit-lines.

Referring back to FIG. 3, the control circuit 500 may receive a command (signal) CMD and an address (signal) ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation. The read operation may include a normal read operation and data recover read operation.

For example, the control circuit 500 may generate control signals CTLs, which are used for controlling the voltage generation circuit 600, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 100 through the string selection line SSL, the plurality of word-lines WLs, and the ground selection line GSL. During the program operation or the read operation, the address decoder 430 may determine one of the plurality of word-lines WLs as a selected word-line and determine rest of the plurality of word-lines WLs except for the selected word-line as unselected word-lines based on the row address R_ADDR.

The voltage generation circuit 600 may generate word-line voltages VWLs, which are used for the operation of the nonvolatile memory device 30 using the power PWR (e.g., VPP) from the memory controller 20, based on the control signals CTLs from control circuit 500. The word-line voltages VWLs may be applied to the plurality of word-lines WLs through the address decoder 430.

For example, during the erase operation, the voltage generation circuit 600 may apply an erase voltage to a well of the memory block and may apply a ground voltage to entire word-lines of the memory block. During the erase verification operation, the voltage generation circuit 600 may apply an erase verification voltage to the entire word-lines of the memory block or sequentially apply the erase verification voltage to word-lines in a word-line basis.

For example, during the program operation, the voltage generation circuit 600 may apply a program voltage to the selected word-line and may apply a program pass voltage to the unselected word-lines. In addition, during the program verification operation, the voltage generation circuit 600 may apply a program verification voltage to the selected word-line and may apply a verification pass voltage to the unselected word-lines.

In addition, during the read operation, the voltage generation circuit 600 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page during the program operation or data read out from the selected page during the read operation. The page buffer circuit 410 may operate in response to a control signal PCTL from the control circuit 500.

The data input/output circuit 420 may be coupled to the page buffer circuit 410 through data lines DLs. During the program operation, the data input/output circuit 410 may receive program data DATA from the memory controller 20 and provide the program data DATA to the page buffer circuit 410 based on the column address C_ADDR received from the control circuit 450. During the read operation, the data input/output circuit 420 may provide read data DATA, which are stored in the page buffer circuit 410, to the memory controller 20 based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 7:
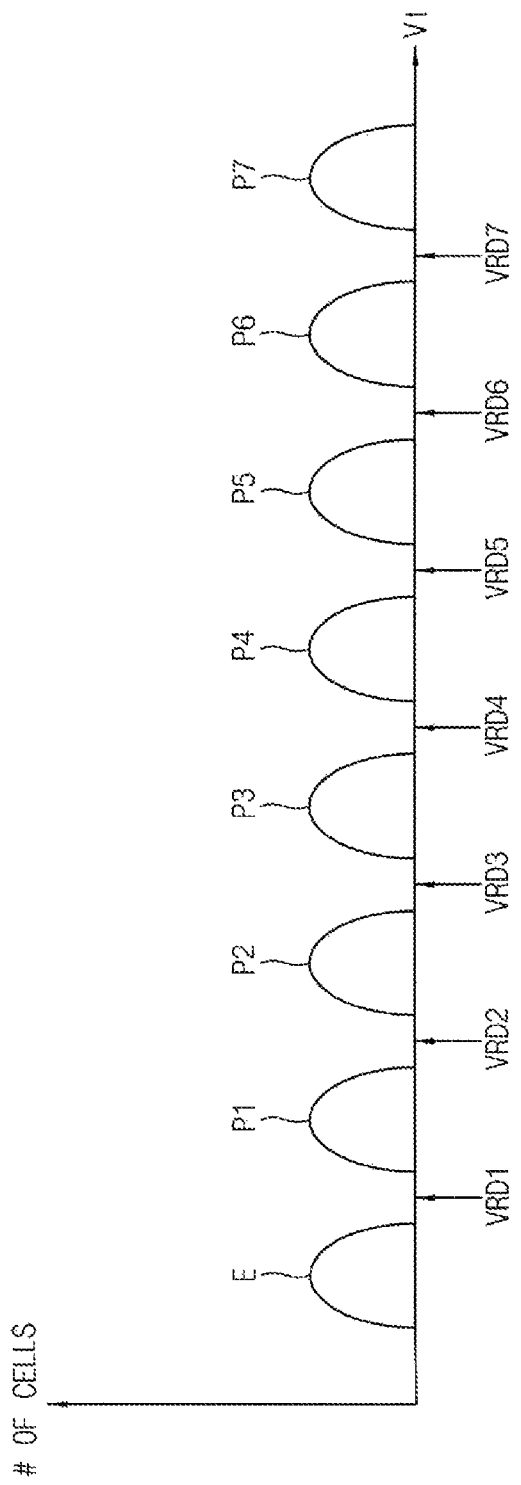
FIG. 7 is a diagram for explaining threshold voltage distributions of memory cells in the memory cell array in FIG. 3.

FIG. 7 is a diagram for explaining threshold voltage distributions of one page in the memory cell array in FIG. 3.

It is assumed that memory cells of the nonvolatile memory device 30 are triple level cells (TLC) in which each memory cell stores three bits and a read voltage set for determining program states of memory cells includes seven different read voltages.

Referring to FIG. 7, each memory cell of the nonvolatile memory device 30 has one of an erase state E and first through seventh program states P1 through P7. Under a control of the memory controller 20, the nonvolatile memory device 30 determines program states of memory cells using a default read voltage set VRD1 through VRD7 and outputs the determined data states as read data.

Voltage levels of the default read voltage set VRD1 through VRD7 may be predetermined depending on cell characteristics. For example, voltage levels of the default read voltage set VRD1 through VRD7 are predetermined depending on a threshold voltage distribution just after memory cells are programmed.

Figure 8:
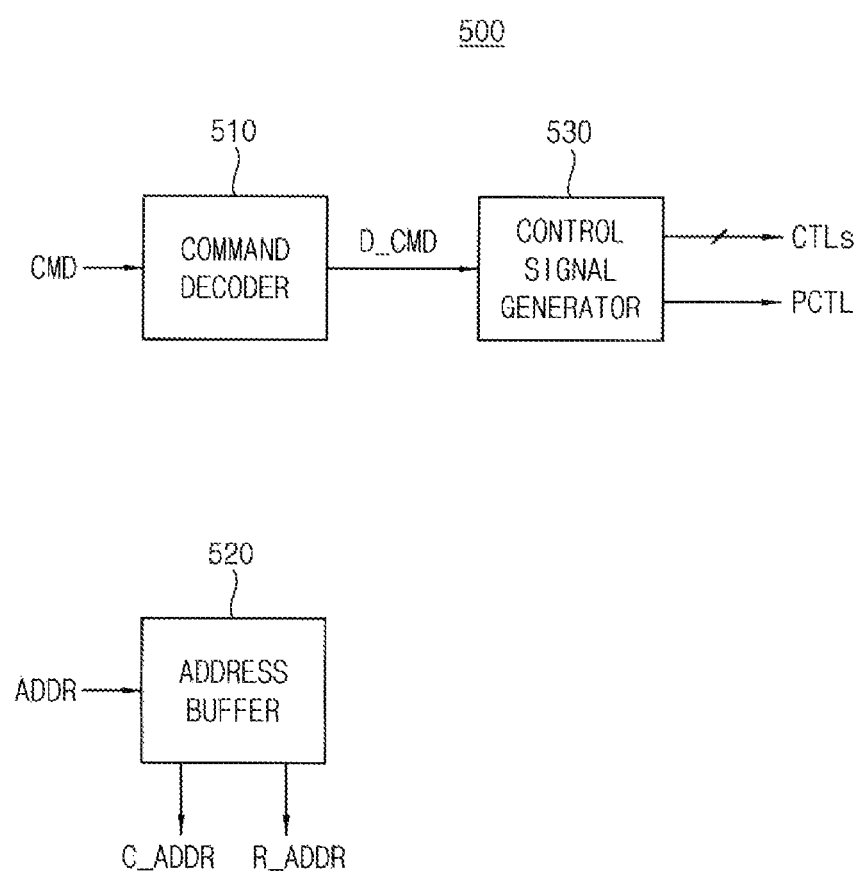
FIG. 8 is a block diagram illustrating the control circuit in the nonvolatile memory device of FIG. 3 according to exemplary embodiments.

FIG. 8 is a block diagram illustrating the control circuit in the nonvolatile memory device of FIG. 3 according to exemplary embodiments.

Referring to FIG. 8, the control circuit 500 may include a command decoder 510, an address buffer 520, and a control signal generator 530.

The command decoder 510 decodes the command CMD and provides a decoded command D_CMD to the control signal generator 530. The address buffer 520 receives the address signal ADDR, provides the row address R_ADDR to the address decoder 430 and provides the column address C_ADDR to the data input/output circuit 420.

The control signal generator 530 receives the decoded command D_CMD, generates the control signals CTLs based on an operation directed by the decoded command D_CMD and provides the control signals CTLs to the voltage generation circuit 600. The control signal generator 530 may provide the control signal PCTL to the page buffer circuit 410.

Figure 9:
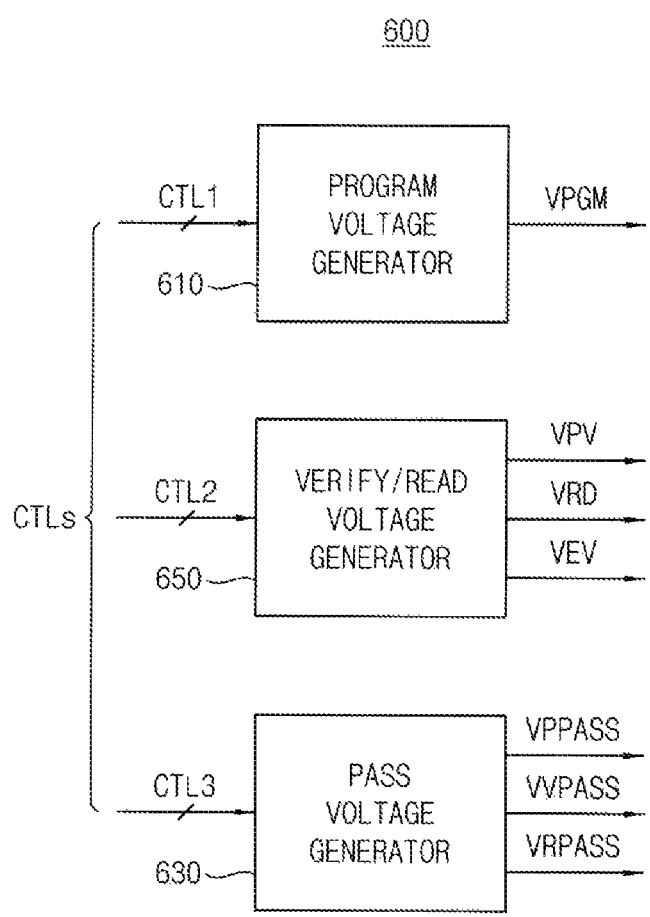
FIG. 9 is a block diagram illustrating the voltage generation circuit in the nonvolatile memory device of FIG. 3 according to exemplary embodiments.

FIG. 9 is a block diagram illustrating the voltage generation circuit in the nonvolatile memory device of FIG. 3 according to exemplary embodiments.

Referring to FIG. 9, the voltage generation circuit 600 includes a program voltage generator 610, a verify/read voltage generator 650 and a pass voltage generator 630.

The program voltage generator 610 may generate a program voltage VPGM according to an operation designated by the decoded command D_CMD, in response to a first control signal CTL1. The program voltage VPGM may be provided to the selected word-line. The first control signal CTL1 may include a plurality of bits which indicate the operation directed by the decoded command D_CMD.

The verify/read voltage generator (also referred to as a first voltage generator) 650 may generate a program verify voltage VPV, a read verify voltage VRD and an erase verify voltage VEV according to operations designated by the decoded command D_CMD, in response to a second control signal CTL2. The program verify voltage VPV, the read verify voltage VRD and the erase verify voltage VEV may be applied to the selected word-line according to the operations. The second control signal CTL2 may include a plurality of bits which indicate the operations directed by the decoded command D_CMD.

The pass voltage generator (also referred to as a second voltage generator) 630 may generate a program pass voltage VPPASS, a verify pass voltage VVPASS and a read pass voltage VRPASS according to operations designated by the decoded command D_CMD, in response to a third control signal CTL3. The program pass voltage VPPASS, the verify pass voltage VVPASS and the read pass voltage VRPASS may be applied to the unselected word-lines according to the operations. The third control signal CTL3 may include a plurality of bits which indicate the operations directed by the decoded command D_CMD.

FIG. 10 is a block diagram illustrating the program voltage generator in the voltage generation circuit of FIG. 9 according to exemplary embodiments.

Referring to FIG. 10, the program voltage generator 610 includes an oscillator 611, a charge pump 612, and a voltage detector 613.

The oscillator 611 outputs an oscillation signal OSC. The charge pump 612 performs a pumping operation in response to a pumping clock CLK_PMG to generate the program voltage VPGM. For example, an output voltage may be raised up to the program voltage VPGM by charging serially connected capacitors with predetermined voltage through a pumping operation. The voltage detector 613 receives the oscillation signal OSC, and detects an output of the charge pump 612 to generate the pumping clock CLK_PGM.

The pass voltage generator 630 in FIG. 9 may have a similar configuration with the program voltage generator 610 of FIG. 10.

Figure 11:
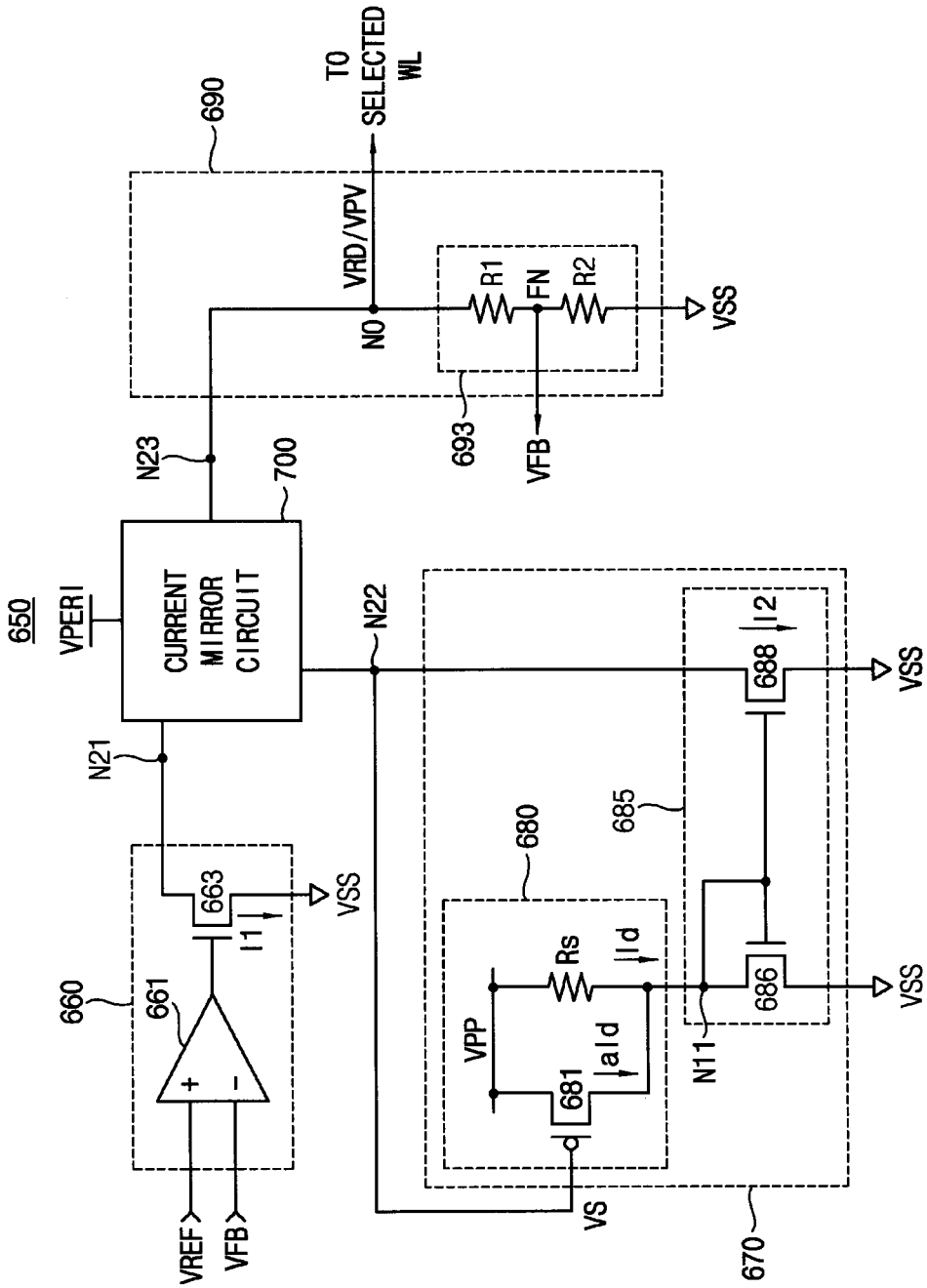
FIG. 11 is a block diagram illustrating the verify/read voltage generator in the voltage generation circuit of FIG. 9 according to exemplary embodiments.

FIG. 11 is a block diagram illustrating the verify/read voltage generator in the voltage generation circuit of FIG. 9 according to exemplary embodiments.

Referring to FIG. 11, the verify/read voltage generator (the first voltage generator) 650 includes a charging circuit 660, a discharging circuit 670, a current mirror circuit 700 and an output circuit 690.

The charging circuit 660 may amplify a difference between a reference voltage VREF and a feedback voltage VFB to generate a first current I1. The charging circuit 660 includes an operational amplifier 661 and an n-channel metal-oxide semiconductor (NMOS) transistor 663. The operational amplifier 661 includes a positive (first) input terminal to receive the reference voltage VREF, a negative (second) input terminal to receive the feedback voltage VFB and an output terminal coupled to a gate of the NMOS transistor 663.

The NMOS transistor 663 is connected to the current mirror circuit 700 at a first node N21. The NMOS transistor 663 includes a drain coupled to the first node N21, a gate coupled to the output terminal of the operational amplifier 661 and a source coupled to a ground voltage VSS. Therefore, a magnitude of the first current I1 may be adjusted by an output of the operational amplifier, which is applied to the gate of the NMOS transistor and corresponds to the difference between the reference voltage VREF and the feedback voltage VFB.

The current mirror circuit 700 is connected to a first power supply voltage VPERI, to the charging circuit 660 at the first node N21, to the discharging circuit 670 at a second node N22, and to the output circuit 690 at a third node N23 respectively. The current mirror circuit 700 generates a second current I2 based on the first current I1 and provides the second current I2 to the discharging circuit 670.

The discharging circuit 670 is connected between a second power supply voltage VPP and the ground voltage VSS, and is connected to the current mirror circuit 700 at the second node N22. The discharging circuit 670 may adjust a discharging amount of the second current I2 based on a sensing voltage at an internal node of the current mirror circuit 700, which reflects a change of the feedback voltage VFB.

A level of the second power supply voltage VPP is higher than a level of the first power supply voltage VPERI. The discharging circuit 670 discharges an output voltage to a target level by adjusting a discharging amount of the second current I2 based on an analog voltage reflecting a change of the feedback voltage VFB.

The discharging circuit 670 may be connected to the internal node in the current mirror circuit 700. However, the discharging circuit 670 may be connected to other node reflecting a change of the feedback voltage VFB and may discharge an output voltage to a target level by performing a similar operation.

The discharging circuit 670 includes a current generation circuit 680 and a current mirror 685. The current generation circuit 680 is connected between the second power supply voltage VPP and a node N11 and provides an adjusting current a*Id (a is a positive real number) and a reference current Id to the node N11. The adjusting current a*Id is based on a sensing voltage VS and the reference current Id is based on the second power supply voltage VPP.

The current generation circuit 680 includes a p-channel metal-oxide semiconductor (PMOS) transistor 681 and a reference resistor Rs. The PMOS transistor 681 includes a source coupled to the second power supply voltage VPP, a gate to receive the sensing voltage VS and a drain coupled to the node N11. The reference resistor Rs is connected between the second power supply voltage VPP and the node N11 in parallel with the PMOS transistor 681. The reference current Id flows through the reference resistor Rs and the adjusting current a*Id flows to the node N11 in response to the sensing voltage VS.

The current mirror 685 is connected to the node N11, the second node N22 and the ground voltage VSS and mirrors a sum of the adjusting current a*Id and the reference current Id as the second current I2. The current mirror 685 includes NMOS transistors 686 and 688. The NMOS transistor 686 includes a drain and a gate coupled to the node N11 and a source coupled to the ground voltage VSS. The NMOS transistor 688 includes a drain coupled to the second node N22, a gate coupled to the node N11 and a source coupled to the ground voltage VSS. Therefore, the second current I2 flows to the ground voltage VSS through the NMOS transistor 688.

The output circuit 690 includes a voltage divider 693. The voltage divider 693 is connected to the third node N23 at an output node NO, and includes a first resistor R1 and a second resistor R2 connected in series between the output node NO and the ground voltage VSS. The voltage divider 693 divides an output voltage VRD/VPV at the output node NO with a ratio of the first resistor R1 and the second resistor R2, and provides the feedback voltage VFB at a feedback node FN. For example, a voltage level of a read verify voltage VRD at the output node NO may be decided by a first ratio of the first resistor R1 and the second resistor R2, and a voltage level of a program verify voltage VPV at the output node NO may be decided by a second ratio of the first resistor R1 and the second resistor R2.

The first resistor R1 and the second resistor R2 are connected to each other at the feedback node FN. A level of the output voltage VRD/VPV is determined by a voltage at the third node N23, corresponding to an output of the current mirror circuit 700, and a level of the feedback voltage VFB is determined by the output voltage VRD/VPV. The output voltage VRD/VPV may be applied to the selected word-line through the address decoder 430.

Figure 12:
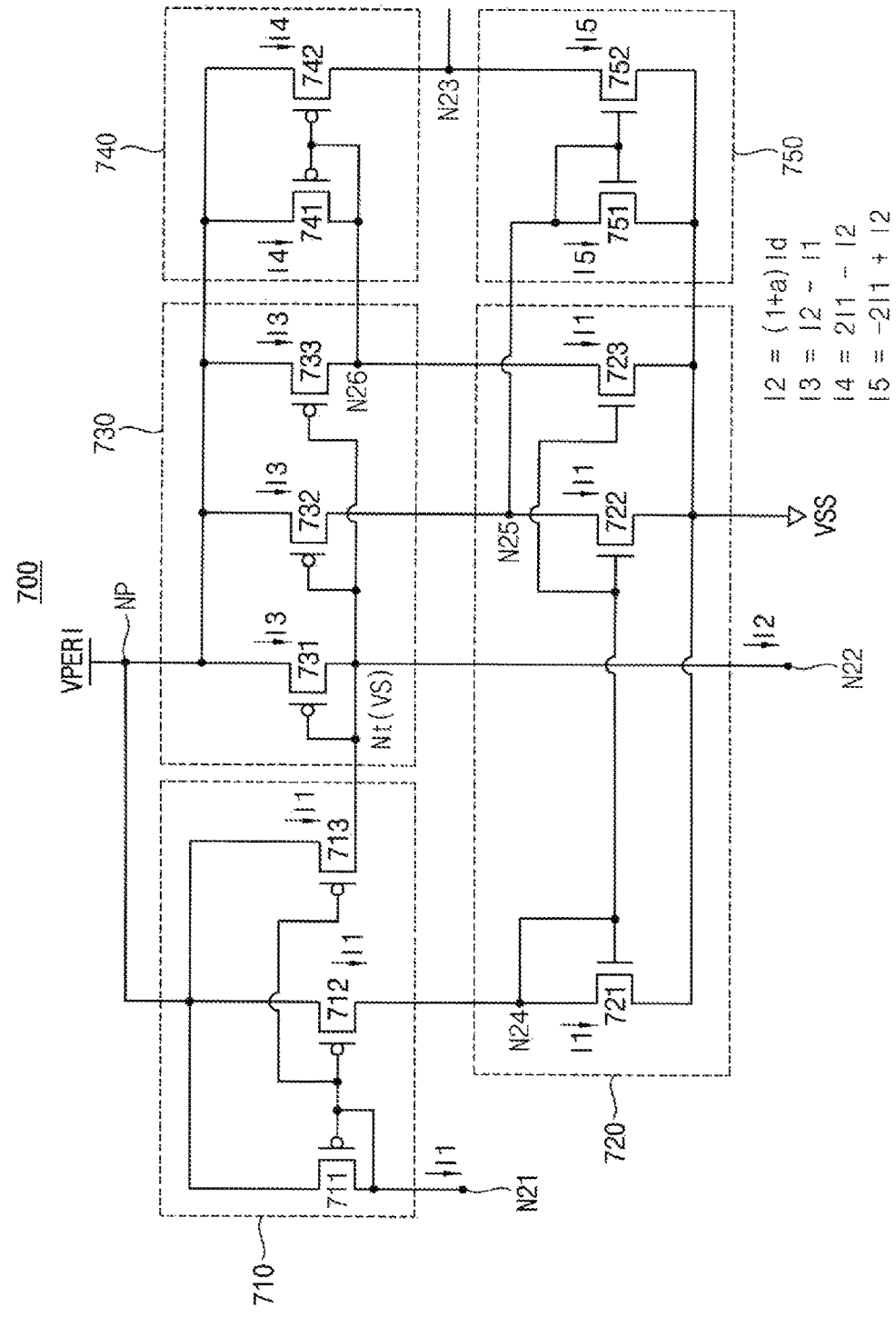
FIG. 12 is a circuit diagram illustrating the current mirror circuit in the verify/read voltage generator of FIG. 11 according to exemplary embodiments.

FIG. 12 is a circuit diagram illustrating the current mirror circuit in the verify/read voltage generator of FIG. 11 according to exemplary embodiments.

Referring to FIG. 12, the current mirror circuit 700 includes a first current mirror 710, a current generation circuit 730, a second current mirror 720, a third current mirror 740 and a fourth current mirror 750.

The first current mirror 710 is connected between the first node N21 and a power node NP coupled to the first power supply voltage VPERI and mirrors the first current I1. The current generation circuit 730 is connected to the power node NP and the first current mirror 710 at an internal node Nt and generates a third current I3 based on the sensing voltage VS of the internal node Nt. The second current mirror 720 is connected to the first current mirror 710 at a fourth node N24, is connected to the current generation circuit 720 at a fifth node N25 and a sixth node N26, and mirrors the first current I1.

The third current mirror 740 is connected to the power node NP and the third node N23 and is connected to the current generation circuit 730 at the sixth node N26, and mirrors a fourth current I4 in response to a voltage of the sixth node N26 to provide the fourth current I4 to the third node N23. The fourth current mirror 750 is connected to the second current mirror 720 at the fifth node N25, is connected to the third node N23 and the ground voltage VSS, and mirrors a fifth current I5 in response to a voltage of the fifth node N25 to draw the fifth current I5 from the third node N23.

The first current mirror 710 includes PMOS transistors 711, 712 and 713. The PMOS transistor 711 is connected between the power node NP and the first node N21 and includes a gate and a drain coupled to the first node N21 and a source coupled to the power node NP. The PMOS transistor 712 is connected between the power node NP and the fourth node N24, and includes a source coupled to the power node NP, a gate coupled to the first node N21 and a drain coupled to the fourth node N24. The PMOS transistor 713 is connected to the power node NP in parallel with the PMOS transistor 712, and includes a source coupled to the power node NP, a gate coupled to the first node N21 and a drain coupled to the internal node Nt.

Each of the PMOS transistors 712 and 713 constitutes a current mirror with the PMOS transistor 711. Therefore, the PMOS transistor 712 provides the first current I1 to the fourth node N24 and the PMOS transistor 713 provides the first current I1 to the internal node Nt.

The current generation circuit 730 includes PMOS transistors 731, 732 and 733. The PMOS transistor 731 includes a source coupled to the power node NP, and a gate and a drain coupled to the internal node Nt. The PMOS transistor 732 includes a source coupled to the power node NP, a gate coupled to the internal node Nt and a drain coupled to the fifth node N25.

The PMOS transistor 733 includes source coupled to the power node NP, a gate coupled to the internal node Nt and a drain coupled to the sixth node N26. Since the PMOS transistors 732 and 733 are connected to the power node NP and the internal node Nt in parallel with the PMOS transistor 731, the third current I3 flows through each of the PMOS transistors 731, 732 and 733 in response to the sensing voltage VS of the internal node Nt. The PMOS transistor 731 provides the third current I3 to the internal node Nt, the PMOS transistor 732 provides the third current I3 to the fifth node N25 and the PMOS transistor 733 provides the third current I3 to the sixth node N26.

The second current mirror 720 includes NMOS transistors 721, 722 and 723. The NMOS transistor 721 includes a drain and a gate coupled to the fourth node N24 and a source coupled to the ground voltage VSS. The NMOS transistor 722 includes a drain coupled to the fifth node N25, a gate coupled to the fourth node N24 and a source coupled to the ground voltage VSS. The NMOS transistor 723 includes a drain coupled to the sixth node N26, a gate coupled to the fourth node N24 and a source coupled to the ground voltage VSS.

Each of the NMOS transistors 722 and 723 constitutes a current mirror with the NMOS transistor 721. Since the first current I1 flows through the NMOS transistor 721, the first current I1 also flows through each of the NMOS transistors 722 and 723. Therefore, the third current I3 may be obtained by the first current I1 from the second current I2 with respect to the internal node Nt. In addition, the second current I2 corresponds to (1+a) times of the reference current Id.

The third current mirror 740 includes PMOS transistors 741 and 742. The PMOS transistor 741 includes a source coupled to the power node NP and a gate and a drain coupled to the sixth node N26. The PMOS transistor 742 includes a source coupled to the power node NP, a gate coupled to the sixth node N26 and a drain coupled to the third node N23. Since the PMOS transistors 741 and 742 constitute a current mirror, the fourth current I4 flows through each of the PMOS transistors 741 and 742 in response to a voltage of the sixth node N26. Therefore, the fourth current I4 may be obtained by subtracting the second current I2 from two times of the first current I1 with respect to the sixth node N26.

The fourth current mirror 750 includes NMOS transistors 751 and 752. The NMOS transistor 751 includes a drain and a gate coupled to the fifth node N25 and a source coupled to the ground voltage VSS. The NMOS transistor 752 includes a drain coupled to the third node N23, a gate coupled to the fifth node N25 and a source coupled to the ground voltage VSS. Since the NMOS transistor 752 constitutes a current mirror with the NMOS transistor 751, the fifth current I5 flows through each of the NMOS transistors 751 and 752. Therefore, the NMOS transistor 752 draws the fifth current I5 from the third node N23. The fifth current I5 may be obtained by subtracting two times of the first current I1 from the second current I2 with respect to the fifth node N25. Since the second current I2 corresponds to (1+a) times of the reference current Id, the fifth current I5 which is discharged (or sinks) through the NMOS transistor 752 may be automatically adjusted by the adjusting current a*Id reflecting a change of the feedback voltage VFB.

Hereinafter, there will be description on operation of the verify/read voltage generator 650 with reference to FIGS. 11 and 12 when a level of the feedback voltage VFB is greater than a level of the reference voltage VREF.

Referring to FIGS. 11 and 12, when a level of the feedback voltage VFB is greater than a level of the reference voltage VREF, an output voltage of the operational amplifier 661 decreases and the first current I1 decreases in response to the decrease of the output voltage of the operational amplifier 661. When the first current I1 decreases, the sensing voltage VS of the internal node Nt decreases and the third current I3 increases in response to the decrease of the sensing voltage VS. Since the sensing voltage VS is applied to the gate of the PMOS transistor 681, the adjusting current a*Id increases in response to the decrease of the sensing voltage VS. When the feedback voltage VFB increases due to coupling noises from a level transition of the adjacent word-line, the adjusting current a*Id increases and the fifth current I5 sinking through the NMOS transistor 752 also increases. Therefore, when the coupling noises from a level transition of the adjacent word-line influences the selected word-line, a set-up time required for the feedback voltage VFB (or, the output voltage VRD/VPV) to be set to the target level may be reduced.

Figure 13:
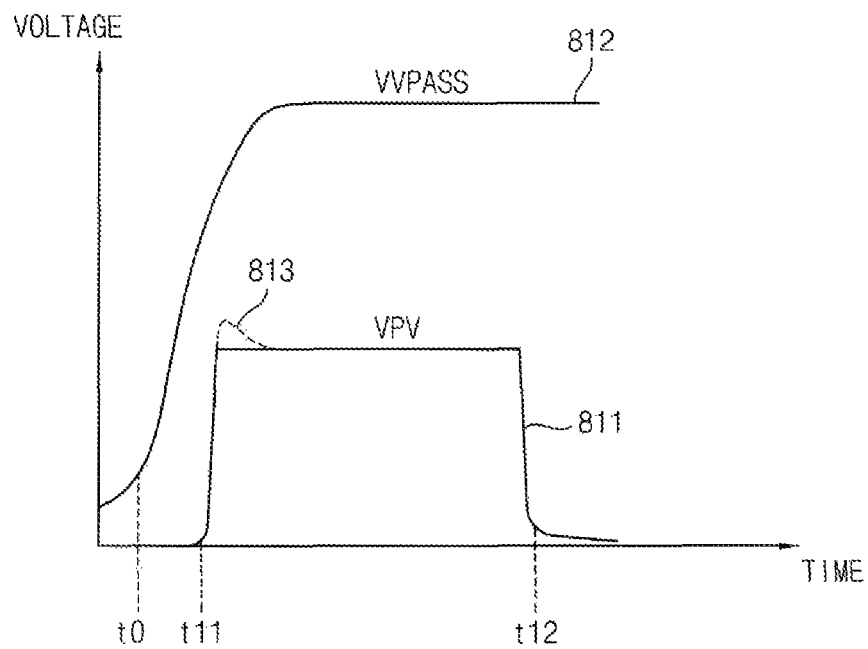
FIG. 13 illustrates that a selected word-line is influenced by a coupling of a voltage on an adjacent word-line.

FIG. 13 illustrates that a selected word-line is influenced by a coupling from voltage transition of an adjacent word-line.

Referring to FIG. 13, when the program verify voltage VPV 811 is applied to a first word-line, i.e., a selected word-line of a memory block in the memory cell array 100, the verify pass voltage VVPASS 812 is applied to the unselected word-lines. The verify pass voltage 812 rises at a first time point t0, and the program verify voltage 811 needs to be maintained with a target level between time points t11 and t12.

A level of the verify pass voltage 812 voltage is greater than a level of the program verify voltage 811. Therefore, a coupling phenomenon 813 in which the level of the first word-line increases due to the verify pass voltage 812 of a second word-line adjacent to the first word-line may occur. As described above, the verify/read voltage generator 650 in FIGS. 11 and 12 may reduce an influence from level transition of the verify pass voltage 812 of the second word-line.

Figure 14:
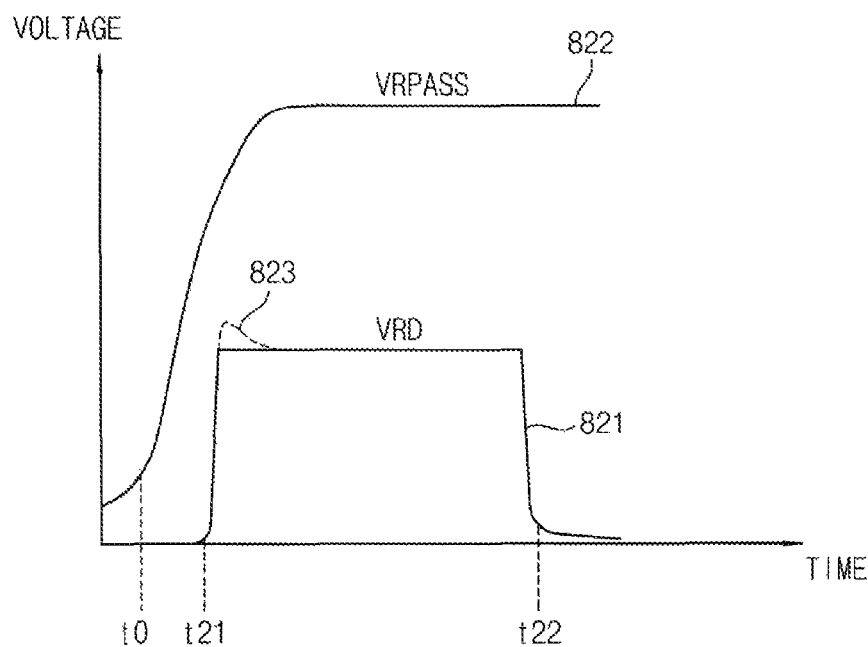
FIG. 14 also illustrates that a selected word-line is influenced by a coupling of a voltage on an adjacent word-line.

FIG. 14 also illustrates that a selected word-line is influenced by a coupling noises from voltage transition of an adjacent word-line.

Referring to FIG. 14, when the read verify voltage VRD or 821 is applied to a first word-line, i.e., a selected word-line of a memory block in the memory cell array 100 the read pass voltage VRPASS 822 is applied to the unselected word-lines. The read pass voltage 822 rises at a first time point t0, and the read voltage 821 needs to be maintained with a target level between time points t21 and t22.

A level of the read pass voltage 822 voltage is greater than a level of the read voltage 821. Therefore, a coupling phenomenon 823 in which the level of the first word-line increases due to the read pass voltage 822 of a second word-line adjacent to the first word-line may occur. As described above, the verify/read voltage generator 650 in FIGS. 11 and 12 may reduce an influence of coupling noises from level transition of the read pass voltage 822 of the second word-line.

Figure 15:
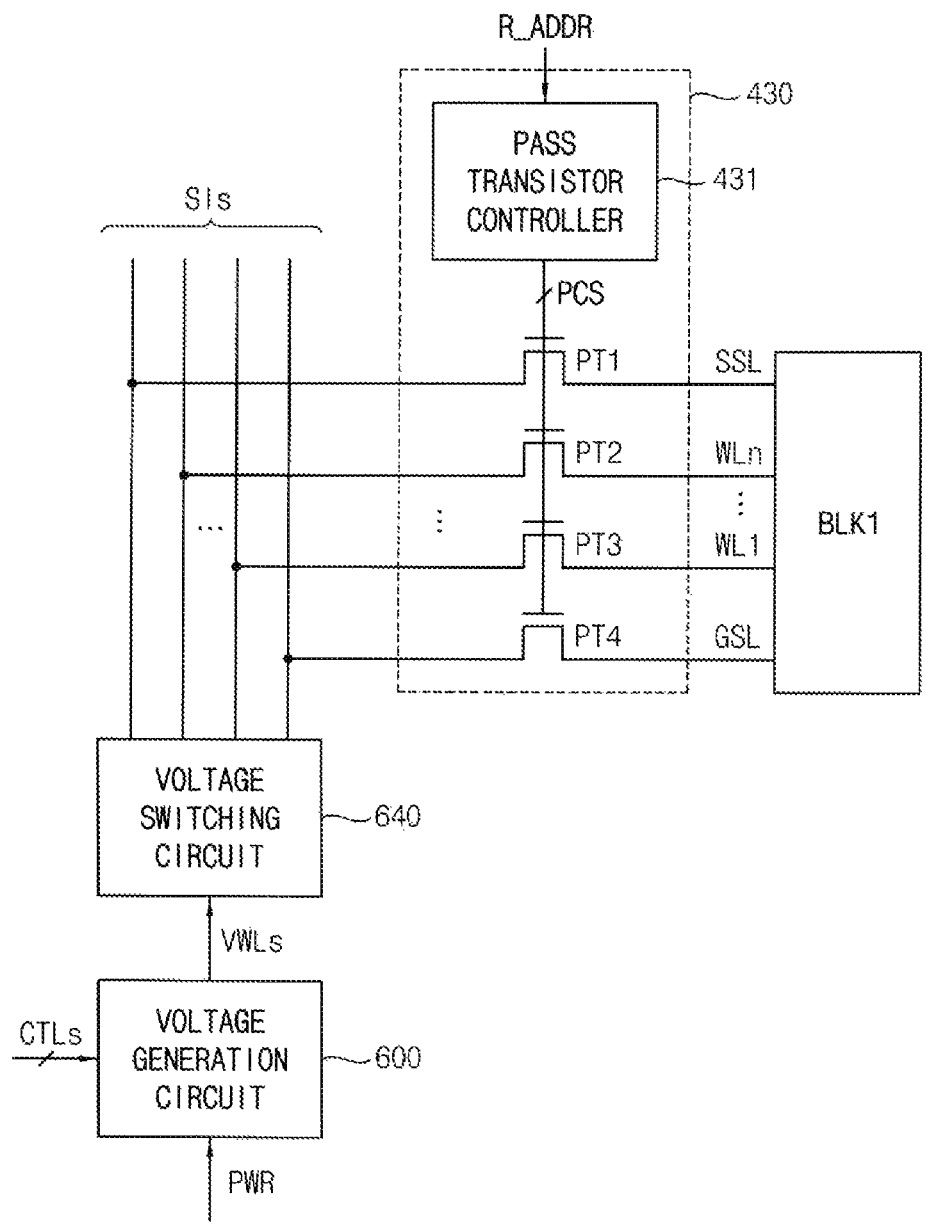
FIG. 15 illustrates a applying voltages on word lines of the nonvolatile memory device of FIG. 3 according to exemplary embodiments.

FIG. 15 illustrates a applying voltages on word lines of the nonvolatile memory device of FIG. 3 according to exemplary embodiments.

A first memory block BLK1 of the memory cell array 100 may be selected for a read operation by the address decoder 430. The voltage generation circuit 600 and a voltage switching circuit 640 provides corresponding voltages to a string select line, word lines and a ground select line. The voltage switching circuit 640 may not be included in the nonvolatile memory device 30.

Referring to FIG. 15, the address decoder 430 is coupled to the voltage switching circuit 640 through a plurality of selection lines SIs, and includes a pass transistor controller 431 and a plurality of pass transistors PT1~PT4 which is coupled to the string selection line SSL, word-lines WL1~WLn and the ground selection line GSL of the first memory block BLK1. The pass transistor controller 431 applies control signals PCS to the pass transistors PT1~PT4 in response to the row address R_ADDR such that the word-line voltage VWLs from the voltage switching circuit 670 or from the voltage generation circuit 600 are transferred to the first memory block BLK1.

Figure 16:
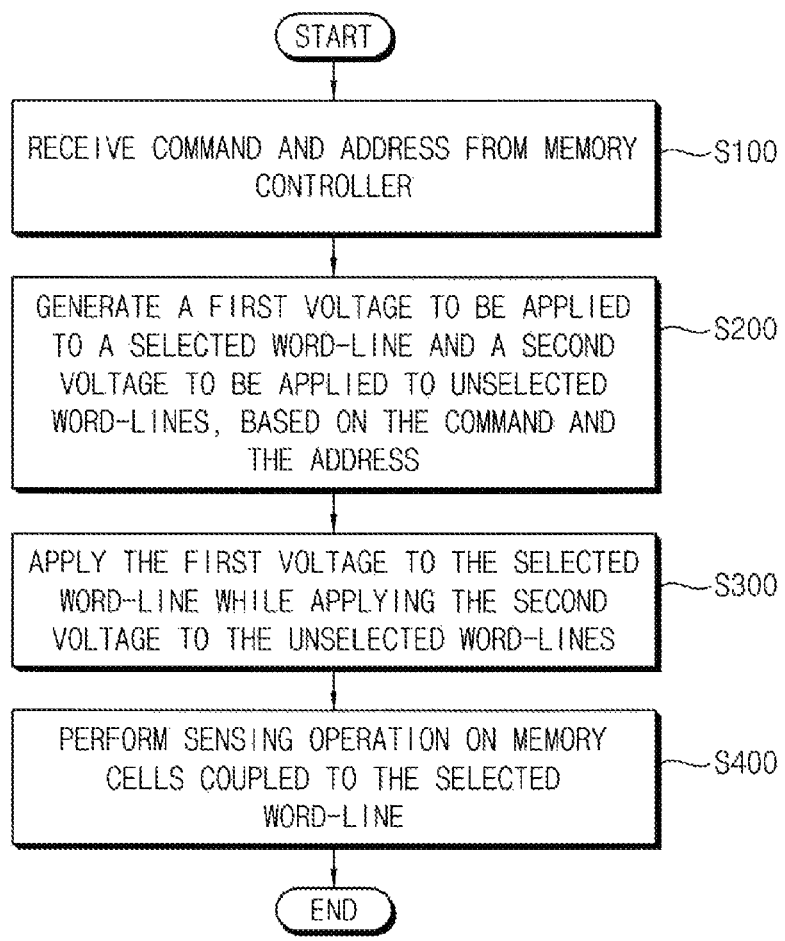
FIG. 16 is a flow chart illustrating a method of operating a nonvolatile memory device according to exemplary embodiments.

FIG. 16 is a flow chart illustrating a method of operating a nonvolatile memory device according to exemplary embodiments.

Referring to FIGS. 1, and 3 through 16, in a method operating a nonvolatile memory device 30 which includes a memory cell array 100 including a plurality of nonvolatile memory cells, the nonvolatile memory device 30 receives the command CMD and the address ADDR from the memory controller 20 (S100).

The control circuit 500, in response to the command CMD and address ADDR, controls the voltage generation circuit 600 to generate a first voltage and a second voltage which are to be applied to a selected first word-line and unselected word-lines respectively. The voltage generation circuit 600 applies the first voltage to the first word-line through the address decoder 430 while applying the second voltage to the unselected word-lines (S300).

A first voltage generator in the voltage generation circuit 600 may generate the first voltage and a second voltage generator in the voltage generation circuit 600 may generate the second voltage. As mentioned above, the first voltage generator may adaptively adjust the first voltage to cancel coupling noises generated from voltage transition of second voltage. The first voltage is applied to the first word line which is selected word line and the second voltage is applied to the second word line which is unselected word line adjacent to the selected word line.

The page buffer circuit 410 performs a sensing operation on first memory cells coupled to the first word-line and outputs sensed data (S400). Second memory cells are coupled to the second word-line and the second memory cells are stacked on the first memory cells.

Figure 17:
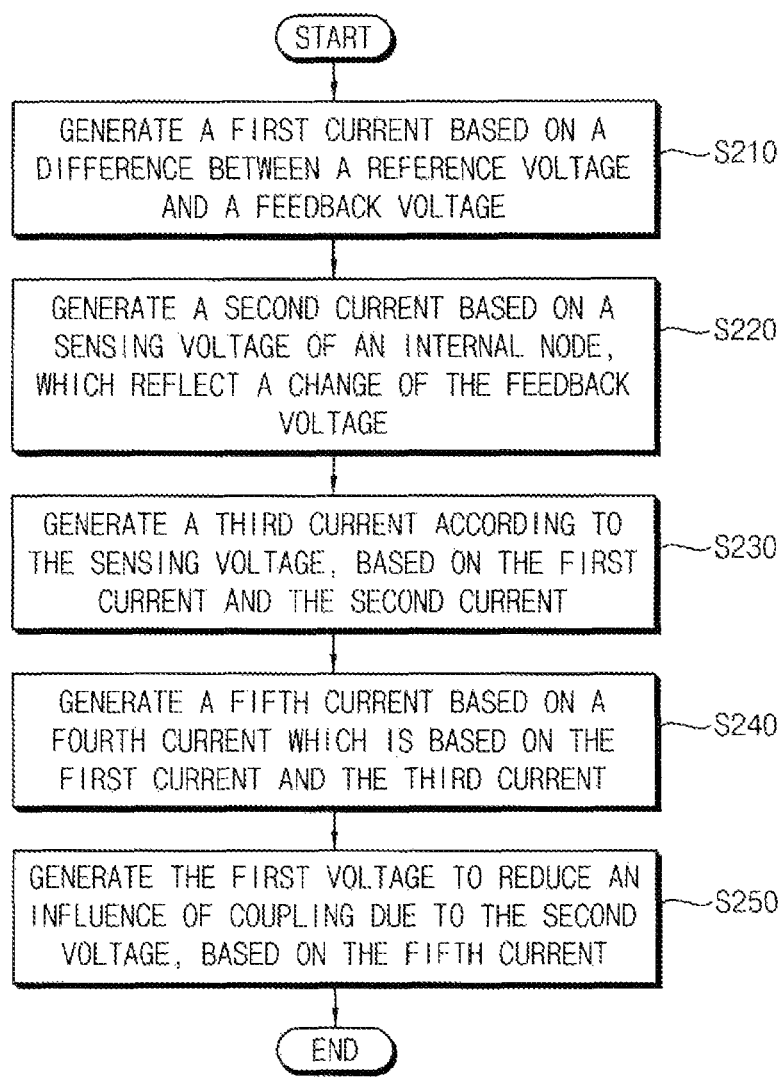
FIG. 17 is a flow chart for illustrating that a first voltage is generated in the method of FIG. 16.

FIG. 17 is a flow chart for illustrating that a first voltage is generated in the method of FIG. 16.

Referring to FIGS. 11, 12 and 17, the charging circuit 660 generates the first current I1 based on a difference between the reference voltage VREF and the feedback voltage VFB (S210). The discharging circuit 670 generates the second current I2 based on the sensing voltage VS of the internal node Nt, which reflects a change of the feedback voltage VFB (S220).

The current generation circuit 730 generates the third current I3 according to the sensing voltage VS, based on the first current I1 and the second current I2 (S230). The third current mirror 740 generates the fourth current I4 based on the third current I3. The fourth current mirror 750 generates the fifth current I5 based on the first current I1 and the third current I3 (S24). Since the fifth current I5 may be obtained by subtracting two times of the first current I1 from the second current I2, and the second current I2 corresponds to (1+a) times of the reference current Id, the fifth current I5 includes the adjusting current a*Id which responds to the sensing voltage VS of the internal node Nt. Therefore, the current mirror circuit 700 provides, at the output node NO, the first voltage which reduces an influence of the coupling of the second voltage on the adjacent word-line by sinking the fifth current I5 to the ground voltage VSS through the NMOS transistor 752 (S250).

As mentioned above, when a level of a first voltage, which is applied to a selected word-line, at the output node, is changed because the first voltage is coupled to a second voltage on an adjacent word-line, the voltage generator may reduce the influence of the coupling of the second voltage on the adjacent word-line adaptively and in analog fashion by generating the adjusting current a*Id determined according to the sensing voltage of the internal node, which reflects a change of the level of the first voltage inverse-proportionally and by sinking the adjusting current a*Id to the ground voltage.

Figure 18:
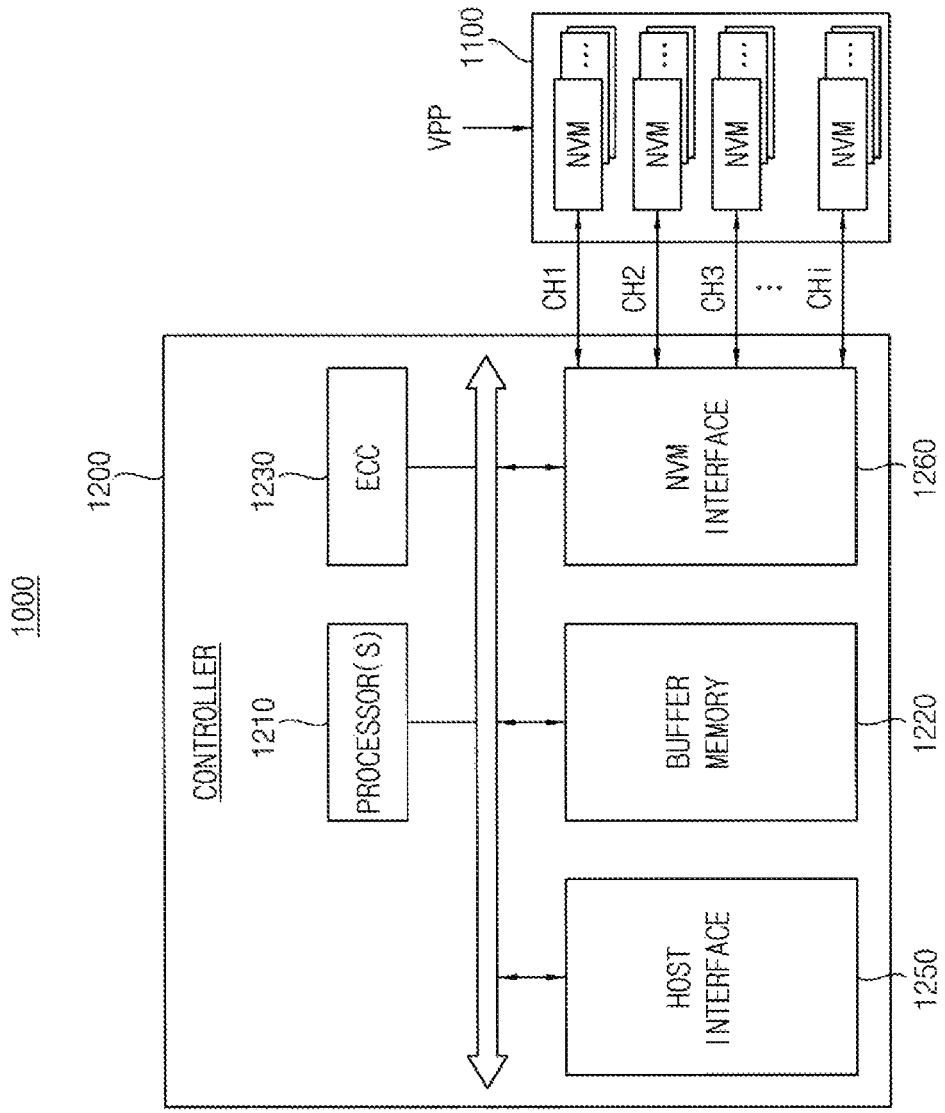
FIG. 18 is a block diagram illustrating a solid state disk or solid state drive (SSD) according to exemplary embodiments.

FIG. 18 is a block diagram illustrating a solid state disk or solid state drive (SSD) according to exemplary embodiments.

Referring to FIG. 18, SSD 1000 includes multiple nonvolatile memory devices 1100 and an SSD controller 1200.

The nonvolatile memory devices 1100 may be optionally supplied with an external high voltage (or a second power supply voltage) VPP. Each of the nonvolatile memory devices 1100 may include the nonvolatile memory device 30 of FIG. 3.

Therefore, each of the nonvolatile memory devices 1100 may include a first voltage generator which applies a first voltage to a selected word-line. The first voltage generator, when a level of the first voltage, which is applied to the selected word-line is changed since the first voltage is coupled to a second voltage on an adjacent word-line, may reduce the influence of the coupling of the second voltage on the adjacent word-line adaptively and in analog fashion by generating the adjusting current determined according to a sensing voltage of an internal node, which reflects a change of the level of the first voltage inverse-proportionally and by sinking the adjusting current to a ground voltage.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 includes multiple memory lines each storing data or a command. The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100.

The exemplary embodiments may be employed by various electronic devices which include nonvolatile memory devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A nonvolatile memory device comprising:
    a memory cell array in which a plurality of nonvolatile memory cells are arranged;
    a voltage generation circuit configured to generate word-line voltages to be applied to word-lines of the memory cell array;
    an address decoder connected to the memory cell array through the word-lines; and
    a control circuit configured to control the voltage generation circuit and the address decoder based on a command and an address,
    wherein the voltage generation circuit comprises a first voltage generator configured to generate a first voltage to be applied to a first word-line which is selected from the word-lines based on the address,
    wherein the first voltage generator is configured to discharge the first voltage on an output node of the first voltage generator to a target level in response to a first current and a second current and to provide the first voltage to the output node connected to the first word-line,
    wherein the first current is based on a feedback voltage obtained by dividing the first voltage,
    wherein the second current is based on a sensing voltage reflecting a change of the feedback voltage,
    wherein a level of the sensing voltage is determined based on the first current, and
    wherein the first voltage generator comprises:
    a charging circuit configured to amplify a difference between a reference voltage and the feedback voltage to generate the first current;
    a current mirror circuit connected to a first power supply voltage and connected to the charging circuit at a first node, the current mirror circuit configured to generate the second current based on the first current;
    a discharging circuit connected to a second power supply voltage and connected to the current mirror circuit at a second node to draw the second current, the discharging circuit configured to adjust discharging amount of the second current based on the sensing voltage; and an output circuit connected to a ground voltage and connected to the current mirror circuit at a third node, the output circuit configured to provide the first voltage based on the first current and the second current to the output node.

2. The nonvolatile memory device of claim 1, wherein the discharging circuit comprises:

a current generation circuit connected between the second power supply voltage and a current summation node, the current generation circuit configured to provide an adjusting current and a reference current, the adjusting current being based on the sensing voltage and the reference current being based on a reference resistor and the second power supply voltage; and a current mirror connected to the current summation node, the second node and the ground voltage, the current mirror configured to mirror a sum of the adjusting current and the reference current as the second current.

3. The nonvolatile memory device of claim 2, wherein the current generation circuit comprises:

a p-channel metal-oxide semiconductor (PMOS) transistor which includes a source connected to the second power supply voltage, a gate receiving the sensing voltage and a drain connected to the current summation node; and a reference resistor connected between the second power supply voltage and the current summation node in parallel with the PMOS transistor, and wherein the current mirror comprises:

a first n-channel metal-oxide semiconductor (NMOS) transistor which includes a drain and a gate connected to each other and the current summation node and a source connected to the ground voltage; and a second NMOS transistor which includes a drain connected to the second node, a source connected to the ground voltage and a gate connected to the current summation node.

4. The nonvolatile memory device of claim 2, wherein:

the second current corresponds to the sum of the adjusting current based on the sensing voltage and the reference current based on the reference resistor and the second power supply voltage, and the sensing voltage is varied to reduce an influence due to coupling to the first word-line generated by a voltage on a second word-line adjacent to the first word-line.

5. The nonvolatile memory device of claim 1, wherein the current mirror circuit comprises:

a first current mirror connected between the first node and a power node connected to the first power supply voltage, the first current mirror configured to mirror the first current;

a current generation circuit connected to the power node and the first current mirror at an internal node providing the sensing voltage, the current generation circuit configured to generate a third current based on the sensing voltage at the internal node;

a second current mirror connected to the first current mirror at a fourth node and connected to the current generation circuit at a fifth node and a sixth node, the second current mirror configured to mirror the first current;

a third current mirror connected to the power node and the third node and connected to the current generation circuit at the sixth node, the third current mirror configured to mirror a fourth current in response to a voltage at the sixth node to provide the fourth current to the third node; and a fourth current mirror connected to the second current mirror at the fifth node and connected to the third node and the ground voltage, the fourth current mirror configured to mirror a fifth current in response to a voltage at the fifth node to draw the fifth current from the third node, and wherein the internal node is the second node.

6. The nonvolatile memory device of claim 5, wherein:

the third current corresponds to a current obtained by subtracting the first current from the second current;

the fourth current corresponds to a current obtained by subtracting the second current from two times of the first current; and the fifth current corresponds to a current obtained by subtracting two times of the first current from the second current.

7. The nonvolatile memory device of claim 5, wherein the first current mirror comprises:

a first p-channel metal-oxide semiconductor (PMOS) transistor connected between the power node and the first node;

a second PMOS transistor, connected between the power node and the fourth node, to provide the first current to the fourth node, the first PMOS transistor and the second PMOS transistor constituting a current mirror; and a third PMOS transistor connected to the power node in parallel with the second PMOS transistor to constitute a current mirror with the first PMOS transistor, the third PMOS transistor connected to the internal node to provide the first current to the internal node.

8. The nonvolatile memory device of claim 5, wherein the second current mirror comprises:

a first n-channel metal-oxide semiconductor (NMOS) transistor, connected between the fourth node and the ground voltage, which includes a gate connected to the fourth node;

a second NMOS transistor connected to the fourth node, the fifth node and the ground voltage to constitute a current mirror with the first NMOS transistor, wherein the second NMOS transistor includes a gate connected to the fourth node to provide the first current to the ground voltage;

a third NMOS transistor connected to the fourth node in parallel with the second NMOS transistor to constitute a current mirror with the first NMOS transistor, wherein the third NMOS transistor includes a gate connected the fourth node to provide the first current to the ground voltage.

9. The nonvolatile memory device of claim 5, wherein current generation circuit comprises:

a first p-channel metal-oxide semiconductor (PMOS) transistor, connected between the power node and the second node, which includes a gate connected to the internal node to provide the third current to the second node;

a second PMOS transistor, connected between the power node and the fifth node, which includes a gate connected to the internal node to provide the third current to the fifth node; and a third PMOS transistor, connected between the power node and the sixth node, which includes a gate connected to the internal node to provide the third current to the sixth node.

10. The nonvolatile memory device of claim 5, wherein third current mirror comprises:
- a first p-channel metal-oxide semiconductor (PMOS) transistor, connected between the power node and the sixth node, which includes a gate connected to the sixth node to generate the fourth current; and
- a second PMOS transistor connected between the power node and the third node to constitute a current mirror with the first PMOS transistor, wherein the second PMOS transistor includes a gate connected to the sixth node to provide the fourth current to the third node.

11. The nonvolatile memory device of claim 5, wherein fourth current mirror comprises:
- a first n-channel metal-oxide semiconductor (NMOS) transistor, connected between the fifth node and the ground voltage, which includes a gate connected to the fifth node to generate the fifth current; and
- a second NMOS transistor connected between the third node and the ground voltage to constitute a current mirror with the first NMOS transistor, wherein the second NMOS transistor includes a gate connected to the fifth node to sink the fifth current to the ground voltage.

12. The nonvolatile memory device of claim 1, wherein the voltage generation circuit further comprises a second voltage generator configured to generate a second voltage to be applied to a second word-line adjacent to the first word-line, and wherein the memory cell array comprises:
- first memory cells coupled to the first word-line; and
- second memory cells coupled to the second word-line, the second memory cells stacked on the first memory cells.

13. The nonvolatile memory device of claim 1, wherein the charging circuit comprises:
- an operational amplifier configured to amplify the difference between the reference voltage and the feedback voltage; and
- an n-channel metal-oxide semiconductor (NMOS) transistor which includes a gate connected to an output node of the operational amplifier, a drain connected to the first node and a source connected to the ground voltage.

14. The nonvolatile memory device of claim 1, wherein:
- the output circuit comprises a voltage divider connected to the third node at the output node,
- the voltage divider includes a first resistor and a second resistor connected in series between the output node and the ground voltage,
- the first resistor and the second resistor are connected to each other at a feedback node, and
- the voltage divider provides the feedback voltage at the feedback node.

* * * * *